(12) United States Patent
Roychowdhury et al.

(10) Patent No.: US 10,474,219 B2
(45) Date of Patent: Nov. 12, 2019

(54) ENABLING SYSTEM LOW POWER STATE WHEN COMPUTE ELEMENTS ARE ACTIVE

(71) Applicant: Intel Corporation, Santa Clara, CA (US)

(72) Inventors: Arojit Roychowdhury, Bangalore (IN); Ramanathan Sethuraman, Bangalore (IN); Ajaya V. Durg, Austin, TX (US); Rakesh A. Ughreja, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 15/529,792

(22) PCT Filed: Nov. 30, 2015

(86) PCT No.: PCT/US2015/063029
§ 371 (c)(1),
(2) Date: May 25, 2017

(87) PCT Pub. No.: WO2016/105876
PCT Pub. Date: Jun. 30, 2016

(65) Prior Publication Data
US 2017/0336854 A1    Nov. 23, 2017

(30) Foreign Application Priority Data

Dec. 27, 2014  (IN) .......................... 6624/CHE/2014

(51) Int. Cl.
*G06F 1/3287* (2019.01)
*G06F 1/3225* (2019.01)
(Continued)

(52) U.S. Cl.
CPC ............ *G06F 1/3287* (2013.01); *G06F 1/324* (2013.01); *G06F 1/3225* (2013.01);
(Continued)

(58) Field of Classification Search
CPC .... G06F 1/3287; G06F 1/3225; G06F 1/3237; G06F 1/324; G06F 1/3243; G06F 1/3253; G06F 1/3275; G06F 1/3296; G06F 15/781
(Continued)

(56) References Cited

U.S. PATENT DOCUMENTS 5,262,998 A  * 11/1993  Mnich ................... G11C 11/406
                                                    365/222
6,947,347 B2 *  9/2005  Fujioka ................. G06F 1/3203
                                                    365/227
(Continued)

FOREIGN PATENT DOCUMENTS

CN         107003712 A       8/2017
EP           2796961 A2     10/2014
(Continued)

OTHER PUBLICATIONS

Office Action received for Taiwanese Patent Application No. 104139698, dated Nov. 28, 2017, 20 pages including 2 pages of English translation and 3 pages of claims in English.
(Continued)

*Primary Examiner* — Aurel Prifti
(74) *Attorney, Agent, or Firm* — Spectrum IP Law Group LLC

(57) ABSTRACT

Methods and apparatus to permit a system low power consumption state when CPU (Central Processing Unit) or generically any compute element is active are described. In an embodiment, a fabric and a memory controller are caused to enter a low power consumption state at least partially in response to a determination that the fabric and the memory controller are idle. The entry into the low power consumption state occurs while a compute element, coupled to the
(Continued)

fabric and the memory controller, is in an active state. Other embodiments are also disclosed and claimed.

25 Claims, 6 Drawing Sheets

(51) Int. Cl.
G06F 1/324 (2019.01)
G06F 1/3234 (2019.01)
G06F 1/3296 (2019.01)
G11C 5/14 (2006.01)
G06F 15/78 (2006.01)
G06F 1/3237 (2019.01)

(52) U.S. Cl.
CPC .......... *G06F 1/3237* (2013.01); *G06F 1/3243* (2013.01); *G06F 1/3253* (2013.01); *G06F 1/3275* (2013.01); *G06F 1/3296* (2013.01); *G06F 15/781* (2013.01); *G11C 5/148* (2013.01); *Y02D 10/126* (2018.01); *Y02D 10/128* (2018.01); *Y02D 10/14* (2018.01); *Y02D 10/151* (2018.01); *Y02D 10/152* (2018.01); *Y02D 10/171* (2018.01); *Y02D 10/172* (2018.01); *Y02D 50/20* (2018.01)

(58) Field of Classification Search
USPC ................. 713/300, 323, 100, 601; 365/227, 365/189.09, 149, 222
See application file for complete search history.

(56) References Cited

U.S. PATENT DOCUMENTS

| | | | | |
|---|---|---|---|---|
| 7,082,073 | B2* | 7/2006 | Casper | G11C 11/406 365/189.09 |
| 7,930,572 | B2* | 4/2011 | Bonavita | G06F 1/3203 713/300 |
| 8,438,358 | B1* | 5/2013 | Kraipak | G11C 7/04 711/167 |
| 8,766,707 | B1* | 7/2014 | Younger | G06F 1/3287 327/534 |
| 9,001,608 | B1* | 4/2015 | Chishti | G11C 11/40611 365/149 |
| 9,971,397 | B2* | 5/2018 | Sanghi | G06F 1/3228 |
| 2005/0278559 | A1* | 12/2005 | Sutardja | G06F 1/3203 713/320 |
| 2006/0259804 | A1* | 11/2006 | Fry | G06F 1/3225 713/324 |
| 2008/0082841 | A1* | 4/2008 | Juenemann | G06F 1/3203 713/300 |
| 2008/0162980 | A1* | 7/2008 | Dahan | G06F 13/1694 713/601 |
| 2009/0204835 | A1* | 8/2009 | Smith | G06F 1/3203 713/323 |
| 2009/0210654 | A1 | 8/2009 | Koul et al. | |
| 2009/0249098 | A1 | 10/2009 | Han et al. | |
| 2009/0292934 | A1* | 11/2009 | Esliger | G06F 1/3203 713/323 |
| 2010/0083019 | A1* | 4/2010 | Aoki | G06F 1/3203 713/320 |
| 2010/0115320 | A1 | 5/2010 | Lim et al. | |
| 2010/0250981 | A1 | 9/2010 | Pamley et al. | |
| 2010/0322318 | A1 | 12/2010 | Sadowski et al. | |
| 2011/0173474 | A1 | 7/2011 | Salsbery et al. | |
| 2012/0017099 | A1 | 1/2012 | David et al. | |
| 2012/0102344 | A1 | 4/2012 | Kocev et al. | |
| 2013/0042126 | A1* | 2/2013 | Ganesan | G06F 1/3225 713/322 |
| 2013/0173902 | A1* | 7/2013 | Sodhi | G06F 1/3243 713/100 |
| 2013/0332753 | A1 | 12/2013 | Varma et al. | |
| 2013/0339633 | A1* | 12/2013 | Nayak | G06F 1/08 711/152 |
| 2014/0189392 | A1 | 7/2014 | Bodio et al. | |
| 2014/0337649 | A1* | 11/2014 | Biswas | G06F 1/3218 713/323 |
| 2014/0380071 | A1 | 12/2014 | Lee et al. | |

FOREIGN PATENT DOCUMENTS

| | | |
|---|---|---|
| EP | 3238004 A1 | 11/2017 |
| TW | 200604842 A | 2/2006 |
| TW | 201431400 A | 8/2014 |
| TW | 201636772 A | 10/2016 |
| WO | 2008042179 A1 | 4/2008 |
| WO | 2016105876 A1 | 6/2016 |

OTHER PUBLICATIONS

Extended European Search Report received for European Patent Application No. 15874067.0, dated Jun. 20, 2018, 10 pages.
International Search Report and Written Opinion received for International Application No. PCT/US2015/063029, dated Mar. 7, 2016, 14 pages.
Communication received for Chinese Patent Application No. 201580064557.4, dated Jun. 19, 2017, 2 pages including 1 page of English translation.
Office Action received for Taiwanese Patent Application No. 104139698, dated May 1, 2018, 4 pages.
International Preliminary Report on Patentability received for International Application No. PCT/US2015/063029, dated Jul. 6, 2017, 11 pages.
Notice of Allowance received for Taiwanese Patent Application No. 104139698, dated Jan. 18, 2019, 7 pages including 1 page of English translation and 4 pages of allowed claims in English.
Letters of Patent received for Taiwanese Patent Application No. 104139698 dated Mar. 11, 2019 as patent No. I653527, 2 pages, including 1 page of English translation.
Communication received for European Patent Application No. 15874067.0 dated Feb. 1, 2019, 1 page.

* cited by examiner

ENABLING SYSTEM LOW POWER STATE WHEN COMPUTE ELEMENTS ARE ACTIVE

FIELD

The present disclosure generally relates to the field of electronics. More particularly, some embodiments generally relate to enabling system low power consumption state when compute element(s) are active.

BACKGROUND

To reduce power consumption, some computing devices include a processor with the ability to perform at various low power (Cx) states. Each C state may indicate a certain level of functionality and corresponding power state. For example, C0 may indicate the processor is operating at normal levels, C1 may indicate the processor is not executing instructions but may return to an executing state quickly, C2 may indicate the processor is to maintain all software-visible information but may take longer to return to full executing state, C3 may indicate the processor is asleep but keeps its cache coherent, C6 may indicate much deeper sleep state where caches are flushed, etc.

However, such a computing device generally includes more than just a processor and these other components may have a direct impact on overall performance and/or power consumption of the computing device.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
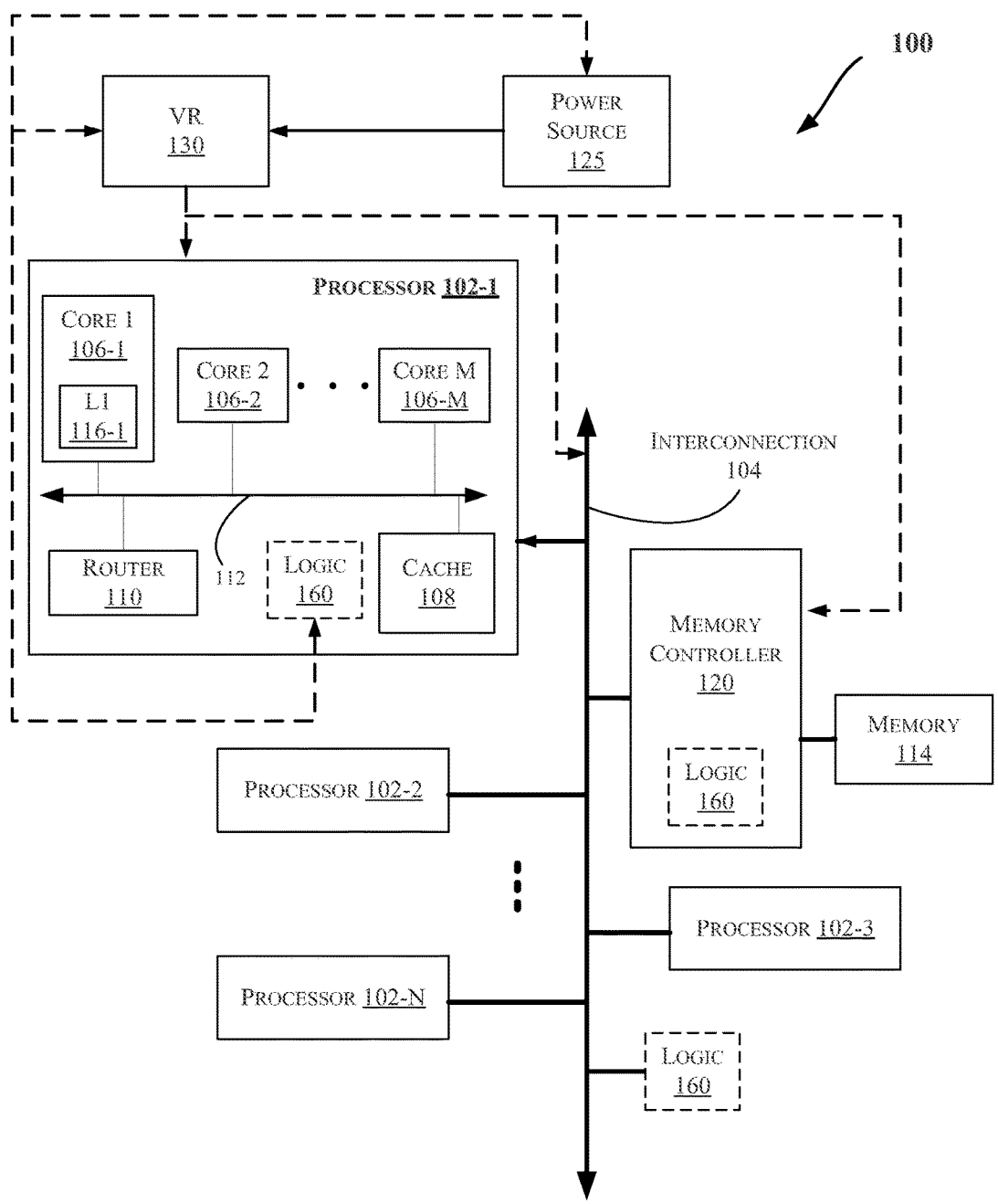
FIGS. 1-2 and 4-6 illustrate block diagrams of various computing systems, according to some embodiments.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As discussed above, components other than a processor may have a direct impact on overall performance and/or power consumption of a computing device. For example, in a System On Chip (SOC or SoC) computing system, components such as a shared or common fabric (i.e., a fabric or interconnection coupling various components of the computing system) and a memory controller (e.g., including a physical layer to couple various components of the SOC to a main memory outside of the SOC) may use a significant portion of the overall SOC power budget (sometimes up to about 45%). The significant amount of power consumption by such components is, in part, due to the lack of low power consumption state utilization in fabric and/or memory controllers on some SOCs.

To this end, some embodiments allow for a low power consumption state which may be entered even while a processor (e.g., in an SOC) is operating in an active power state. The low power consumption may be applied to one or more components of a computing system through a lowered operating clock frequency and/or power gating (or modifying the operating voltage) of the components(s) that are to enter the low power consumption state. An embodiment introduces a new low power consumption state for an SOC, where the (e.g., shared) memory controller and/or the (e.g., common or shared) fabric on the SOC remain in (or enter) a low power consumption state while the processor on the SOC is in an active state (e.g., C0 state). The processor may then process data within its local memory or cache hierarchy (such as L1 (Level 1), L2 (Level 2), L3 (Level 3) cache(s), etc.). Further, to allow such components to enter (or stay in) the low power consumption state, the processor does not access the (e.g., common or shared) fabric and/or (e.g., shared) memory controller.

Moreover, some embodiments may be further extended to other computing system (or SOC) components such as compute elements, including, for example, a GPU (Graphics Processing Unit), media processing (e.g., audio or video media processing for example by a DSP (Digital Signal Processing) component), imaging, etc. As with the case mentioned with respect to the processor above, other components may perform their task using their respective local memory (or cache) to allow the (e.g., shared) memory controller and/or (e.g., common or shared) fabric to enter or remain in a low power consumption state even when the other components are in an active state.

As discussed herein, some of the power consumption states may be in accordance with those defined under Advanced Configuration and Power Interface (ACPI) specification (e.g., revision 5.0a, Nov. 13, 2013) and/or Unified Extensible Firmware Interface (UEFI) Specification (e.g., version 2.4, published July, 2013). Furthermore, a number of C states may be used. For example, C0 may indicate the processor is operating at normal levels, C1 may indicate the processor is not executing instructions but may return to an executing state quickly, C2 may indicate the processor is to maintain all software-visible information but may take longer to return to full executing state, C3 may indicate the processor is asleep but keeps its cache coherent, C6 may indicate much deeper sleep state where caches are flushed, etc. Also, variations of ACPI C2 and C3 states may include a "deep sleep" state (e.g., C6), a "deeper sleep" state (e.g., C7), etc.

Moreover, the techniques discussed herein may be provided in various computing systems (e.g., including a mobile computing device, for example, a smartphone, tablet, UMPC (Ultra-Mobile Personal Computer), laptop computer, Ultrabook™ computing device, smart watch, smart glasses, etc.), such as those discussed with reference to FIGS. 1-6. More particularly, FIG. 1 illustrates a block diagram of a computing system 100, according to an embodiment. The system 100 includes one or more processors 102-1 through 102-N (generally referred to herein as "processors 102" or "processor 102"). The processors 102 may communicate via an interconnection (or fabric) 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 160, memory controllers such as those discussed with reference to FIGS. 4-6 (including NVM (Non-Volatile Memory), for example, flash memory, an SSD (or Solid State Drive), etc.), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in (volatile and/or non-volatile) memory 114 (also referred to herein interchangeably as "main memory") for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC) (such as L1 and/or L2 caches). Also, each of the cores 106 may include a level 1 (L1) cache (116-1) (generally referred to herein as "L1 cache 116"). Various components of the processor 102-1 may communicate with the cache 108 directly, through a bus or fabric (e.g., the bus 112), and/or a memory controller or hub.

The system 100 may also include a (e.g., platform) power source 125 (e.g., a Direct Current (DC) power source or an Alternating Current (AC) power source) to provide power to one or more components of the system 100. The power source 125 could include a PV (Photo Voltaic) panel, wind generator, thermal generator water/hydro turbine, etc. In some embodiments, the power source 125 may include one or more battery packs (e.g., charged by one or more of a PV panel, wind generator, thermal generator water/hydro turbine, plug-in power supply (for example, coupled to an AC power grid), etc.) and/or plug-in power supplies.

The power source 125 may be coupled to components of system 100 through a Voltage Regulator (VR) 130. Moreover, even though FIG. 1 illustrates one power source 125 and a single voltage regulator 130, additional power sources and/or voltage regulators may be utilized. For example, one or more of the processors 102 may have corresponding voltage regulator(s) and/or power source(s). Also, the voltage regulator(s) 130 may be coupled to the processor 102 via a single power plane (e.g., supplying power to all the cores 106) or multiple power planes (e.g., where each power plane may supply power to a different core or group of cores, and/or other component(s) of the system 100). Additionally, while FIG. 1 illustrates the power source 125 and the voltage regulator 130 as separate components, the power source 125 and the voltage regulator 130 may be incorporated into other components of system 100. For example, all or portions of the VR 130 may be incorporated into the power source 125, an SOC (such as those discussed with reference to FIGS. 2 and/or 6), and/or processor 102.

As shown in FIG. 1, memory 114 may be coupled to other components of system 100 through memory controller 120. System 100 also includes logic 160 to facilitate power management of one or more components of system 100 (including for example, memory controller 120 and/or interconnection or fabric(s) 104 and/or 112), as will be further discussed herein with reference to the remaining figures. Even though logic 160 is shown in several optional locations in system 100, the logic 160 may be located elsewhere in system 100. In an embodiment, logic 160, memory controller 120, and caches 116-1 and/or 108 are internal to an SOC computing system (such as those discussed with reference to FIGS. 2 and/or 6), while the main memory 114 is external to the SOC computing system.

As discussed above, some embodiments allow for a low power consumption state which may be entered even while a processor (e.g., in an SOC) is operating in an active power state. The low power consumption may be applied to one or more components of a computing system through a lowered operating clock frequency and/or power gating (or modifying the operating voltage) of the components(s) that are to enter the low power consumption state. An embodiment introduces anew low power consumption state for an SOC, where the (e.g., shared) memory controller and/or the (e.g., common or shared) fabric on the SOC remain in (or enter) a low power consumption state while the processor on the SOC is in an active state (e.g., C0 state). The processor may then process data within its local memory or cache hierarchy (such as L1 (Level 1), L2 (Level 2), L3 (Level 3) cache(s), etc.). Further, to allow such components to enter (or stay in) the low power consumption state, the processor does not access the (e.g., common or shared) fabric and/or (e.g., shared) memory controller.

Moreover, some embodiments may be further extended to other computing system (or SOC) components such as compute element(s), including, for example, a GPU (Graphics Processing Unit), media processing logic (e.g., audio or video media processing logic for example by a DSP (Digital Signal Processing) component), imaging (or image processing) logic, etc. As with the case mentioned with respect to the processor above, other components may perform their task using their respective local memory (or cache) to allow the (e.g., shared) memory controller and/or (e.g., common or shared) fabric to enter or remain in a low power consumption state even when the other components are in an active state.

Moreover, some solutions may only use a lower power consumption state for the fabric or memory controller while the processor is in one of the deepest low power consumption states (for example, C6 or C7). However, there are situations where a processor is in an active (e.g., C0 state) state but the processor does not require fabric and/or memory (such as Dynamic Random Access Memory (DRAM)) accesses, e.g., due to sufficient caching within local memory or local cache hierarchy. Accordingly, some embodiments may be applied during one or more of the following situations: (a) processor is active (e.g., C0 state) and operating by accessing its internal/local memory hierarchy, for example, while the processor is decoding audio content—in this case there is no need for keeping the fabric and/or memory controller in an active state; and/or (b) processor is active (e.g., C0 state) and one or more compute elements (e.g., media, graphics, imaging, etc.) are active and both are processing from their respective internal/local memories, for example, during video playback—again in this case there is no need for keeping the fabric and/or memory controller in an active state.

Hence, some embodiments may be applied in one or more of the following applications: (1) audio content, e.g., MP3 (Moving Picture Experts Group Layer-3 Audio), playback, e.g., with audio post-processing; (2) video content playback and/or streaming; and/or (3) video content recording. Some embodiments may provide power benefits in range of 25-40% at SOC level for audio and video content playback/recording applications.

Figure 2:
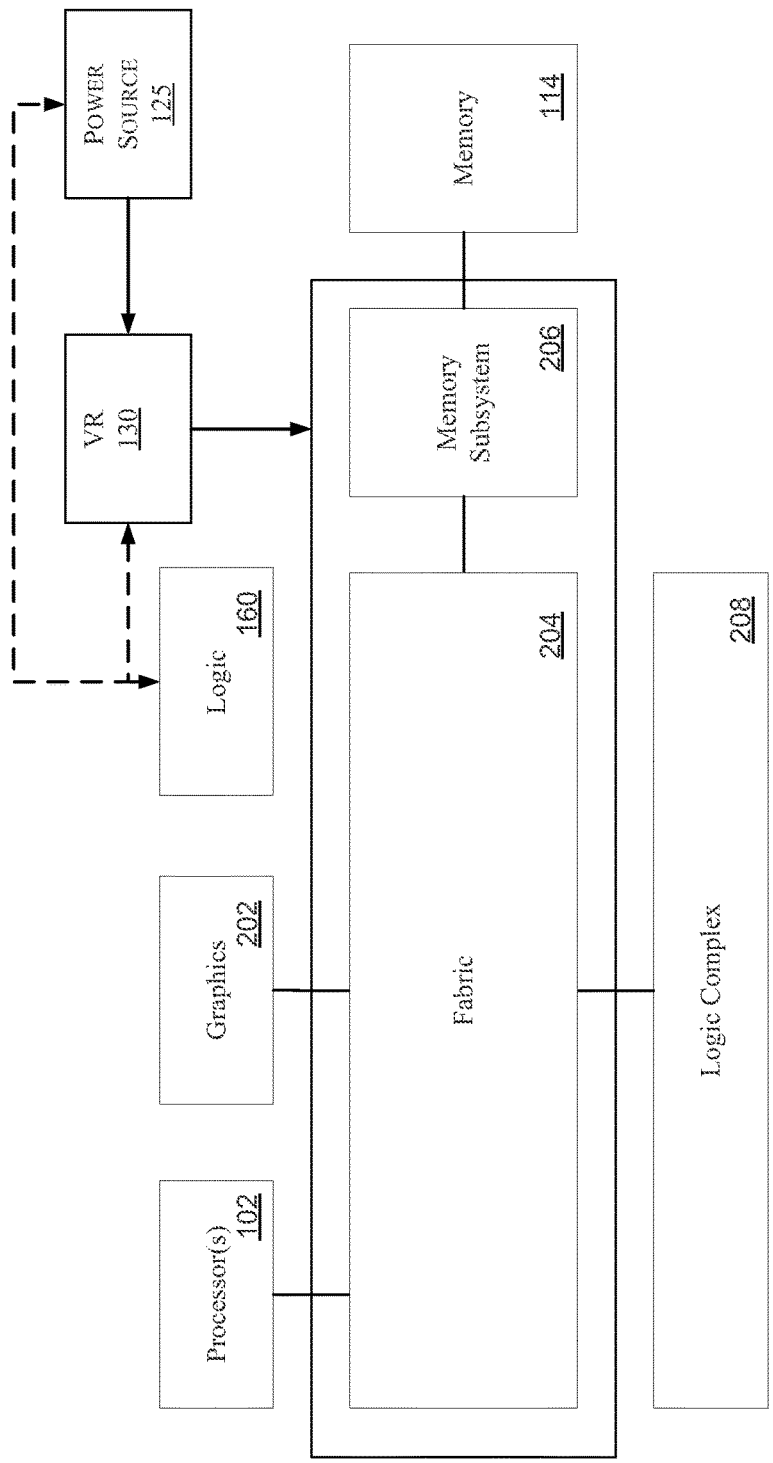

FIG. 2 illustrates a block diagram of a computing system 200 in accordance with an embodiment. System 200 illustrates the coupling of various components that reside on an SOC computing system, including one or more: processor(s) 102, graphics logic 202 (such as a GPU, or other logic that executes instructions/operations corresponding to graphics content), fabric 204 (which may be the same or similar to interconnects 104 and/or 112, and may include a bridge or network on-chip with control logic to arbitrate data exchanges between one or more SOC components and component(s) external to the SOC such as the main memory 114), memory subsystem logic 206 (which may be the same or similar to the memory controller 120 of FIG. 2, where in an embodiment memory subsystem 206 may additionally include an I/O (Input/Output) interface or physical layer (PHY) to communicate with one or more external I/O devices), and/or logic complex 208 (e.g., including logic for communication with relatively low frequency content (e.g., audio content) and/or logic for communication with relatively high frequency content (e.g., video content)).

Referring to FIG. 2, an SOC architecture is illustrated where multiple compute elements (e.g., processor 102, graphics logic 202, imaging logic, media engine, etc.) and peripheral devices are coupled through a (e.g., common or shared) fabric/network 204 and memory controller/subsystem 206 to the main memory 114. In an embodiment, these compute elements (and/or other IP logic blocks) access their individual local memory/cache(s) where applicable, with no activity on fabric 204 and memory controller/subsystem 206. Accordingly, the fabric 204 and/or memory controller/subsystem 206 may be put into an inactive or low power consumption state (by the logic 160) to improve power consumption and/or heat generation efficiency.

Moreover, in some implementations, the fabric and memory controller/subsystem are kept in an active state even when such components have no activity, e.g., in order to keep the latency to memory access low and not decrease performance for sensitive workloads. However, as mentioned before, such approaches results in up to 45% overhead on SOC power due to active state on fabric and memory controller/subsystem.

Figure 3:
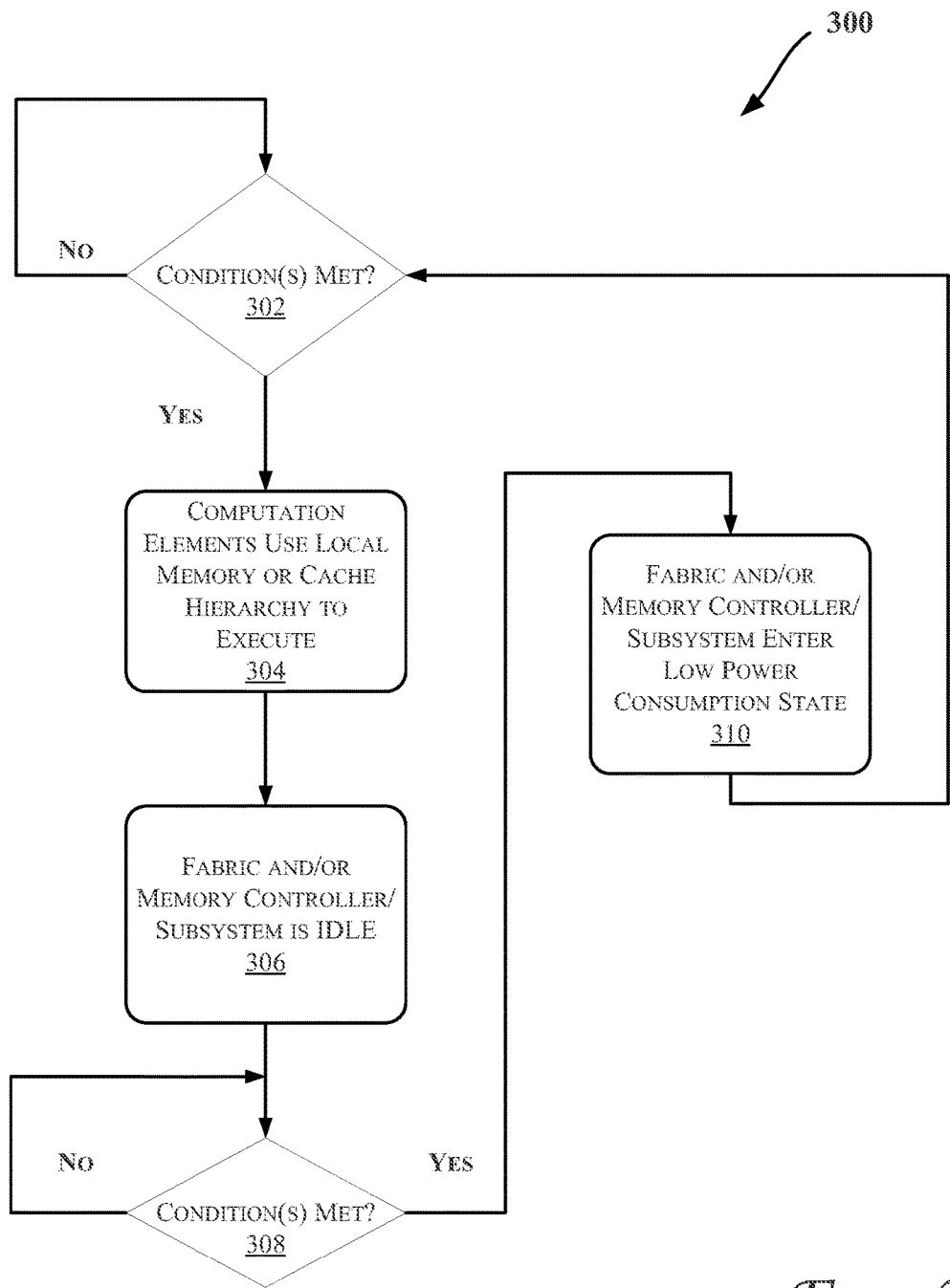
FIG. 3 illustrates a flow diagram in accordance with an embodiment.

FIG. 3 illustrates a flow diagram of a method 300 to enter a low power consumption state, according to an embodiment. Method 300 may be used to enter a low power consumption state even while a processor (e.g., in an SOC) is operating in an active power state, e.g., as discussed with reference to FIGS. 1-2. In one embodiment, various components discussed with reference to FIGS. 1-2 and 4-6 may be utilized to perform one or more of the operations discussed with reference to FIG. 3. In an embodiment, one or more operations of FIG. 3 are implemented in logic (such as logic 160).

Referring to FIGS. 1-3, at an operation 302, it is determined whether one or more conditions to enter a low power consumption has been detected. In some embodiments, one or more of the following conditions are met (at operation 302) to allow the fabric 204 and/or memory controller/subsystem 206 to enter into a low power consumption state (e.g., as determined or caused by logic 160): (a) idleness: detect idleness on the fabric 204 and/or memory controller 206 (e.g., using an algorithm for entering DRAM self-refresh or otherwise at least partially in response to the main memory 114 entering self-refresh operation); (b) Low Performance Demand: processor 102 (and/or other compute elements such as graphics logic 202, imaging logic, media engine, etc.) is operating in a low performance state or lower power consumption state than a normal state (e.g., lower power consumption state than C0), which may be indicated by LFM (Low Frequency Mode—such as a lowest operating frequency point or voltage level of the processor); (c) make use of one or more different hardware events across the SOC to detect phases of low memory access and supplement the above (a) and (b) conditions; and/or (d) make use of software hints to supplement conditions (a) and (b) above, e.g., providing hints of performance or power needs through a power management framework.

At an operation 304, compute elements (e.g., processor 102, graphics logic 202, imaging logic, media engine, etc.) operate using their local memory and/or cache hierarchy. At an operation 306, the fabric 204 and/or memory controller/subsystem 206 is idle. At an operation 308, it is determined whether one or more of the conditions of operation 302 have been met (e.g., the processor 102 (or another compute element) has exited a low power consumption state and/or exit from idle on the fabric and/or memory controller/subsystem). If so, at operation 310, the fabric and/or memory controller/subsystem exit their respective low power consumption state and method 300 resumes with operation 302; otherwise, method 300 returns to operation 308 and waits for reversal of one or more of the conditions.

Moreover, in a mobile computing device (such as a smartphone, tablet, UMPC (Ultra-Mobile Personal Computer), laptop computer, Ultrabook™ computing device, smart watch, smart glasses, etc.), high performance use-cases are turbo frequency bound whereas low performance use-cases are Low Frequency Mode (LFM) bound. Table 1 below illustrates frequency and memory bandwidth characteristics of few sample workloads tracked in the mobile computing device segments.

TABLE 1

| USE-CASES | PROCESSOR LFM RESIDENCY (%) | PROCESSOR TURBO RESIDENCY (%) | PROCESSOR DRAM BANDWIDTH (MB/S) | COMMENTS |
| --- | --- | --- | --- | --- |
| S0-Idle | 100% | 0% | 25 | Low Performance |
| Audio playback w/Post processing | 100% | 0% | 100 | |
| Video playback (1080p30) | 100% | 0% | 100 | |
| Video Record (1080p30) | 100% | 0% | 150 | |
| Video Streaming (720p30) | 100% | 0% | 170 | |
| Dhrystone | 0% | 100% | 0 | High Performance |
| CoreMark | 0% | 100% | 0 | |
| GL Bench Egypt HD offscreen | 6% | 94% | 500 | |

From the above characterization, it is evident that hardware accelerated cases like audio and video playback/record on SOCs may run at LFM frequency, with low processor-memory bandwidth (e.g., about 150 MB/s). Hence, there are long intervals of no memory accesses through the fabric, e.g., enabling sufficient idle time on the fabric and/or memory controller/subsystem to allow for an opportunity for fabric/memory controller/subsystem to enter low power states. To this end, an embodiment processor's frequency at LFM is used to trigger conditions for low power state entry for the (e.g., common or shared) fabric and/or memory subsystem/controller(s).

Table 2 below summarizes fabric and memory controller/subsystem states in relation to other sample compute elements, according to some embodiments.

TABLE 2

| COMPO-NENTS | POTENTIAL IMPLEMEN-TATIONS | SOME EMBODI-MENTS | COM-MENTS |
| --- | --- | --- | --- |
| Processor | Active (C0) | Active (C0) | executing from local memory/cache(s) and assuming no main memory access |
| Fabric | Active (S0) | Low power (S0ix) | provide improved low power states on fabric and/or memory controller through appropriate clock (e.g., operating frequency modification) and/or power gating (e.g., operating voltage modification) |
| Memory Controller | Active (S0) | Low power (S0ix) | |
| Memory Interface/PHY | Shallow Self Refresh | Deep Self Refresh | |
| Main Memory (e.g., DRAM) | Shallow Self Refresh | Deep Self Refresh | |

Generally, "S0ix" or "S0iX" refers to improved idle power state(s) achieved by platform-level power management that is event driven (e.g., based on logic 160, OS (Operating System), and/or software application input) instead of a traditional idle power state that may be driven either by a user or based on a determination that a platform has been idle for too long (based on a pre-programmed time, for example). In some embodiments, at least some of the power consumption states discussed herein may be in accordance with or similar to those defined under ACPI specification (e.g., revision 5.0a, Nov. 13, 2013) and/or UEFI Specification (e.g., version 2.4, published July, 2013).

For high performance use-cases, e.g., where the processor operates at turbo frequency, an embodiment can be partially applied wherein potential opportunities of fabric and/or memory controller/subsystem clock gating (and/or frequency or voltage modification) can be exploited depending on the application performance needs. Given the low bandwidth situations mentioned above, any impact from snoop traffic may be minimal as well. However, in cases where snoop traffic becomes important, system design can address such issues (for example, in audio playback) by the processor processing being limited to one processor core through module shielding.

As an example, some embodiments are applied to MP3 playback with Dolby® Sound (DS1 or Digital Signal 1) effects. Audio code/data fetch phase is a critical power hungry phase of this use-case during which audio post processing code (i.e., DS1) is fetched from main memory 114 (also referred to herein as system DRAM) and fully resides within the processor internal memory (e.g., L2 cache). Similarly, audio data is fetched in batches and stored in local buffer to reduce the number of DRAM accesses. Once code and data resides in processor's L1/L2 cache, further DRAM accesses are not needed until the entire buffer length is processed (e.g., less than about 35 of KB for Mp3/AAC decoders and about 300 KB for Dolby DS1 effects), Hence, during this phase, the fabric and/or memory controller/subsystem are switched to a low power state.

In an embodiment, the power benefits for an SOC power consumption (in mW) for MP3 playback with Dolby DS1 post processing using processor-based decode can reach 35%. In mobile computing devices (such as those discussed above), the power benefit is a substantial improvement not only in percentage but also in absolute power consumption as there are stringent power requirements by customers which can impact design win or loss for manufacturers. Furthermore, such embodiments may be extended to other IP logic blocks (e.g., GPU, imaging logic, media logic, etc.) when these logic blocks are processing data from their local memory/cache hierarchies. Also, similar techniques as illustrated in the conditions discussed above may be used along with other conditions that can be tailored based on targeted product segments and compute element needs.

Figure 4:
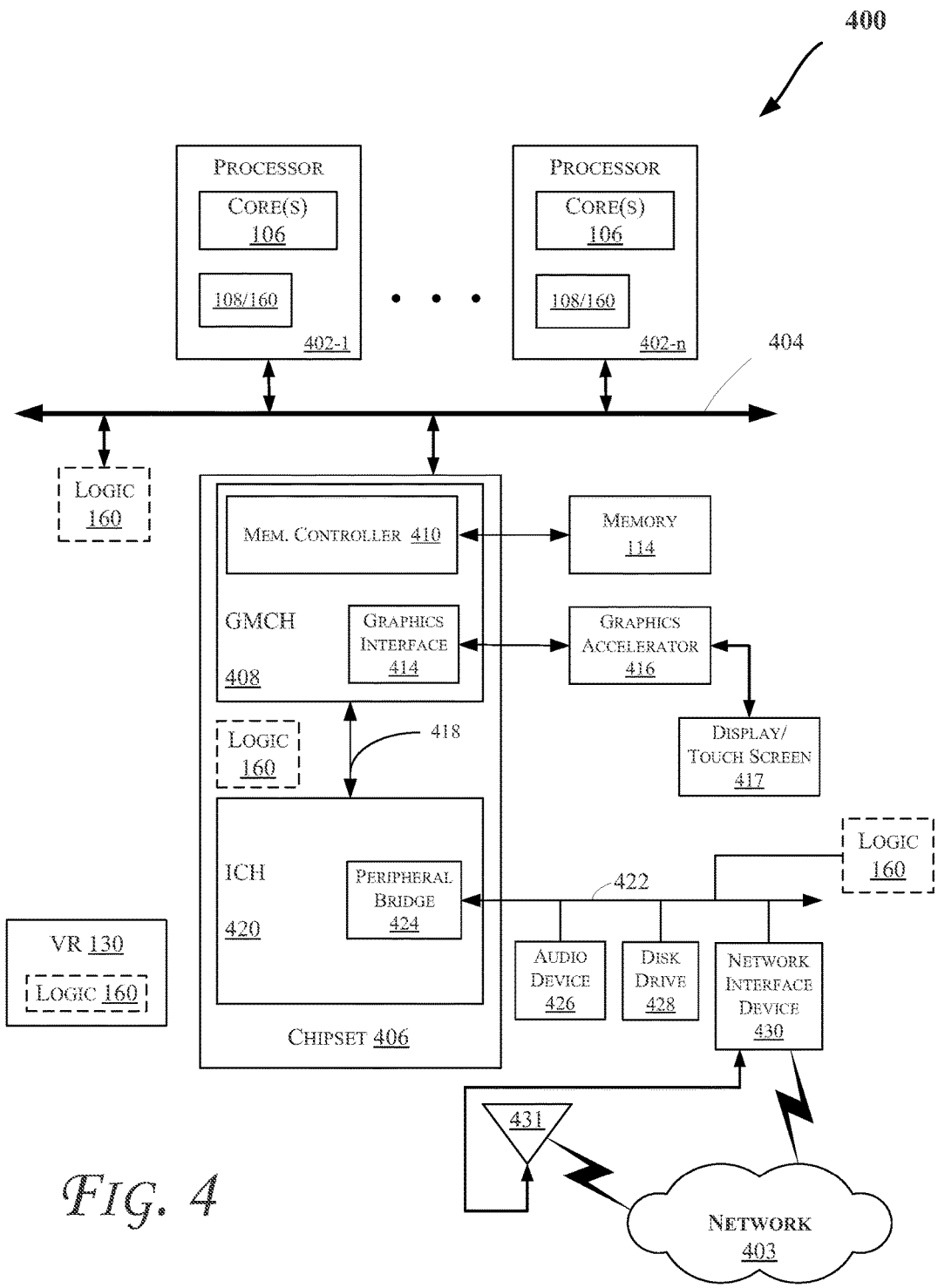

FIG. 4 illustrates a block diagram of a computing system 400 in accordance with an embodiment. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G ($4^{th}$ Generation (wireless/mobile communications)), Low Power Engine (LPE), etc.). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-3 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 and/or memory subsystem 206 of FIG. 2 in various embodiments) that communicates with the memory 114. System 400 may also include logic 160 in various locations (such as those shown in FIG. 4 but can be in other locations within system 400 (not shown)). The memory 114 may store data, including sequences of instructions that are executed by the CPU 402, or any other device included in the computing system 400. In one embodiment, the memory 114 may include one or more volatile/non-volatile storage (or memory) devices such as random access memory (RAM), dynamic RAM (DRAM), synchronous DRAM (SDRAM), static RAM (SRAM), or other types of storage devices such as a hard disk, nanowire memory, Ferro-electric transistor random access memory (FeTRAM), magnetoresistive random access memory (MRAM), flash memory, Spin Torque Transfer Random Access Memory (STTRAM), Resistive Random Access Memory, 3D Cross Point Memory such as PCM (Phase Change Memory), a Solid State Drive (SSD) with NAND/NOR memory, etc. Additional devices may communicate via the interconnection network 404, such as multiple CPUs and/or multiple system memories.

The GMCH 408 may also include a graphics interface 414 that communicates with a graphics accelerator 416. In one embodiment, the graphics interface 414 may communicate with the graphics accelerator 416 via an accelerated graphics port (AGP) or Peripheral Component Interconnect (PCI) (or PCI express (PCIe) interface). In an embodiment, a display device 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display device 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n, etc.), cellular interface, 3G, 4G, LPE, etc.) communicate with the network 403. Other devices may communicate via the bus 422. Also, various components (such as the network interface device 430) may communicate with the GMCH 408 in some embodiments. In addition, the processor 402 and the GMCH 408 may be combined to form a single chip. Furthermore, the graphics accelerator 416 may be included within the GMCH 408 in other embodiments.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
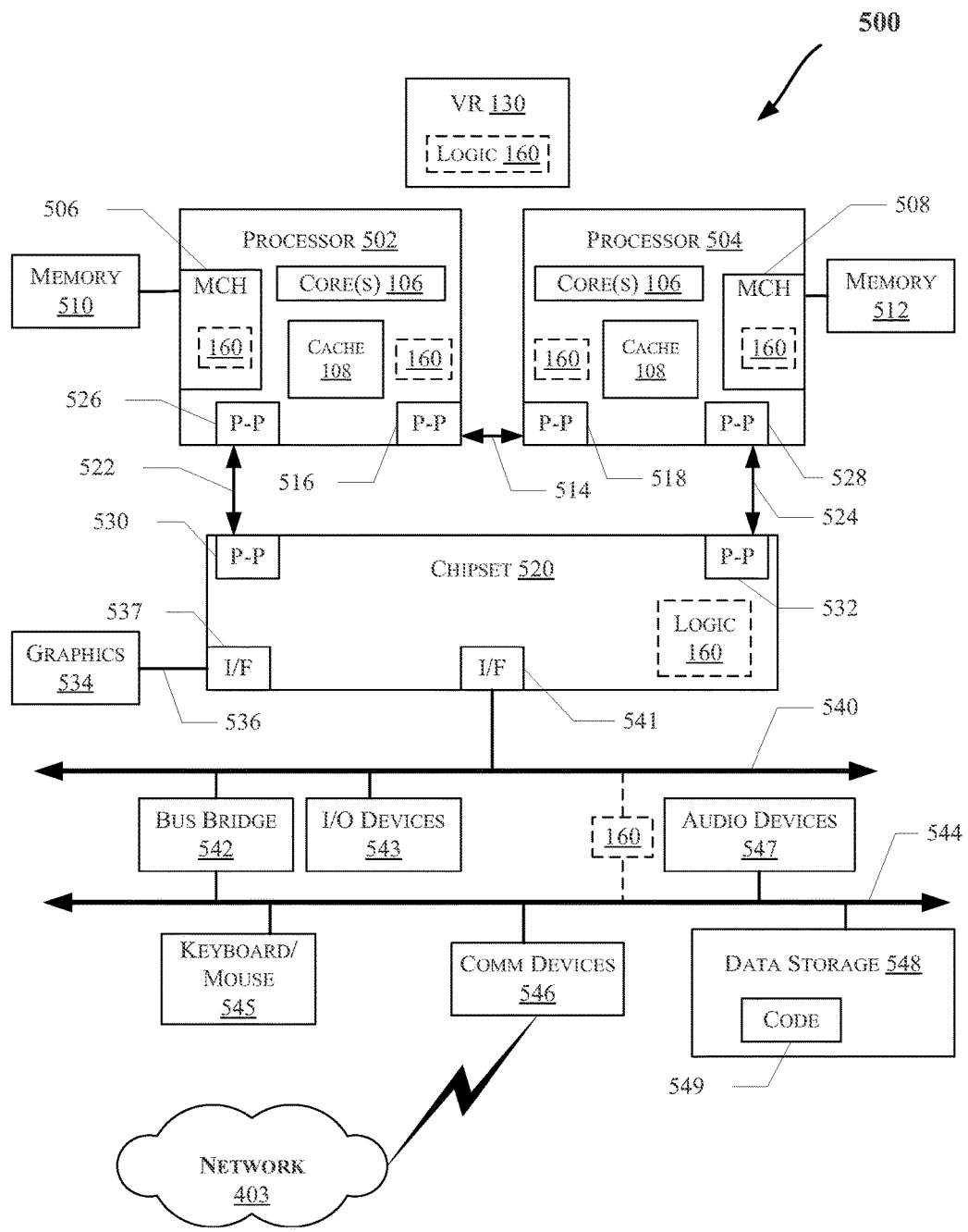

FIG. 5 illustrates a computing system 500 that is arranged in a point-to-point (PtP) configuration, according to an embodiment. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 (and/or memory subsystem 206) and/or logic 160 of FIGS. 1-3 in some embodiments.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

As shown in FIG. 5, one or more of the cores 106 and/or cache 108 of FIG. 1 may be located within the processors 502 and 504. Other embodiments, however, may exist in other circuits, logic units, or devices within the system 500 of FIG. 5. Furthermore, other embodiments may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

Figure 6:
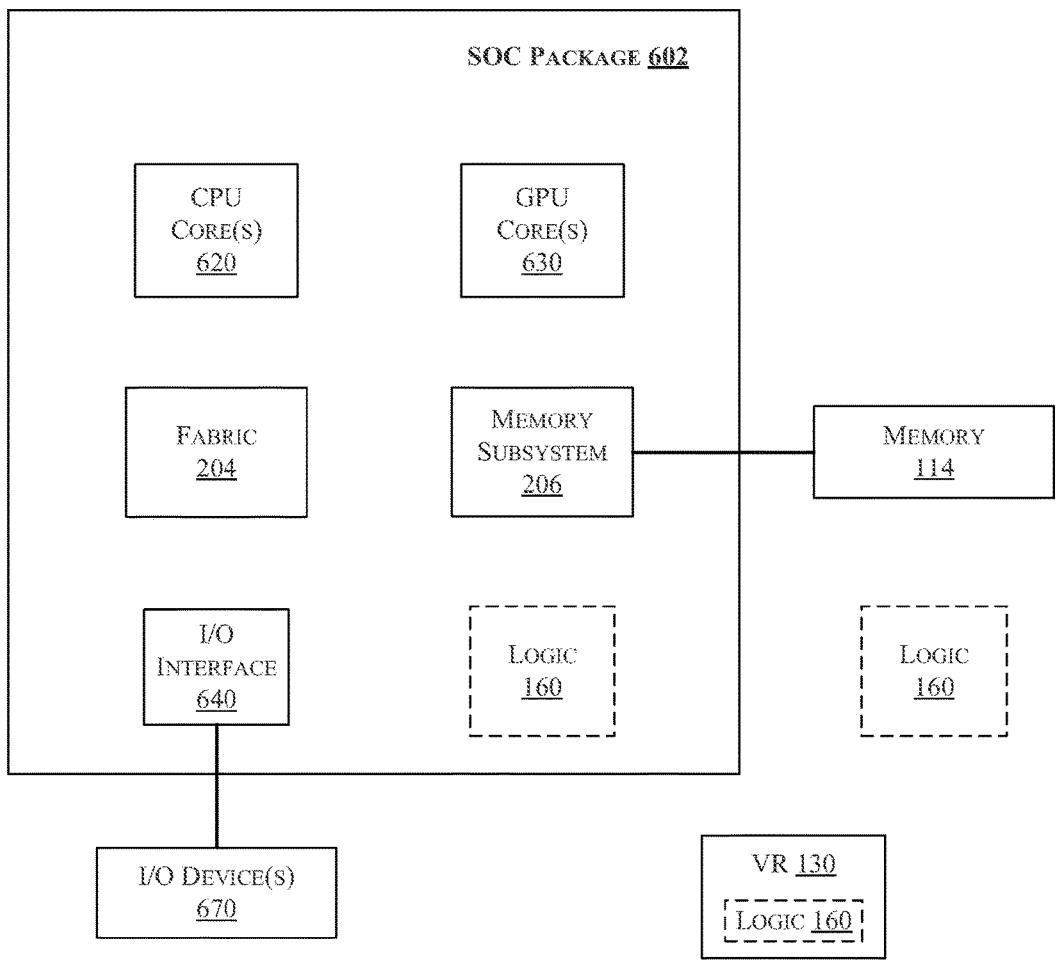

In some embodiments, one or more of the components discussed herein can be embodied on a System On Chip (SOC) device. FIG. 6 illustrates a block diagram of an SOC package in accordance with an embodiment. As illustrated in FIG. 6, SOC 602 includes one or more Central Processing Unit (CPU) cores 620, one or more Graphics Processor Unit (GPU) cores 630, an Input/Output (I/O) interface 640, and the memory controller/subsystem 206. Various components of the SOC package 602 may be coupled to an interconnect or bus such as fabric 204 discussed herein with reference to the other figures. Also, the SOC package 602 may include more or less components, such as those discussed herein with reference to the other figures. Further, each component of the SOC package 602 may include one or more other components, e.g., as discussed with reference to the other figures herein. In one embodiment, SOC package 602 (and its components) is provided on one or more Integrated Circuit (IC) die, e.g., which are packaged onto a single semiconductor device.

As illustrated in FIG. 6, SOC package 602 is coupled to the main memory 114 (which is external to the SOC package 602) via an interface (or PHY) of the memory controller/subsystem 206. In an embodiment, the memory 114 (or a portion of it) can be integrated on the SOC package 602.

The I/O interface 640 may be coupled to one or more I/O devices 670, e.g., via an interconnect and/or bus such as discussed herein with reference to other figures. I/O device(s) 670 may include one or more of a keyboard, a mouse, a touchpad, a display, an image/video capture device (such as a camera or camcorder/video recorder), a touch screen, a speaker, or the like. Furthermore, SOC package 602 may include/integrate the logic 160 in an embodiment. Alternatively, the logic 160 may be provided outside of the SOC package 602 (i.e., as a discrete logic).

The following examples pertain to further embodiments. Example 1 includes an apparatus comprising: logic, at least a portion of which is in hardware, to cause a fabric and a memory controller to enter a low power consumption state at least partially in response to a determination that the fabric and the memory controller are idle and while a compute element, coupled to the fabric and the memory controller, is in an active state. Example 2 includes the apparatus of example 1, wherein the active state is to comprise an operating state in which the compute element is executing one or more operations by accessing a local memory or cache of the compute element instead of accessing a main memory. Example 3 includes the apparatus of example 2, wherein a System On Chip (SOC) integrated circuit is to comprise the logic, the fabric, and the memory controller, wherein the main memory is external to the SOC. Example 4 includes the apparatus of example 2, wherein the logic is to cause the fabric and the memory controller to enter the low power consumption state at least partially in response to the main memory entering a self-refresh operation. Example 5 includes the apparatus of example 1, wherein a system on chip integrated circuit is to comprise the logic, the fabric, and the memory controller. Example 6 includes the apparatus of example 1, wherein the compute element is to comprise one or more of: a processor, having one or more processor cores, a graphics processing unit, image processing logic, or media processing logic. Example 7 includes the apparatus of example 1, wherein a memory subsystem on an SOC integrated circuit is to comprise the memory controller and a physical input/output interface. Example 8 includes the apparatus of example 1, wherein the logic is to cause the fabric and the memory controller to enter the low power consumption state at least partially in response to occurrence of one or more hardware events in an SOC integrated circuit. Example 9 includes the apparatus of example 1, wherein the logic is to cause the fabric and the memory controller to enter the low power consumption state at least partially in response to occurrence of one or more software hints in an SOC integrated circuit.

Example 10 includes a method comprising: causing a fabric and a memory controller to enter a low power consumption state at least partially in response to a determination that the fabric and the memory controller are idle and while a compute element, coupled to the fabric and the memory controller, is in an active state. Example 11 includes the method of example 10, wherein the active state comprises an operating state in which the compute element is executing one or more operations by accessing a local memory or cache of the compute element instead of accessing a main memory. Example 12 includes the method of example 11, further comprising causing the fabric and the memory controller to enter the low power consumption state at least partially in response to the main memory entering a self-refresh operation. Example 13 includes the method of example 11, further comprising coupling the memory controller to the main memory via a physical input/output interface. Example 14 includes the method of example 10, further comprising causing the fabric and the memory controller to enter the low power consumption state at least partially in response to occurrence of one or more hardware events in an SOC integrated circuit. Example 15 includes the method of example 10, further comprising causing the fabric and the memory controller to enter the low power consumption state at least partially in response to occurrence of one or more software hints in an SOC integrated circuit.

Example 16 includes a computer-readable medium comprising one or more instructions that when executed on a processor configure the processor to perform one or more operations to: cause a fabric and a memory controller to enter a low power consumption state at least partially in response to a determination that the fabric and the memory controller are idle and while a compute element, coupled to the fabric and the memory controller, is in an active state. Example 17 includes the computer-readable medium of example 16, wherein the active state comprises an operating state in which the compute element is executing one or more operations by accessing a local memory or cache of the compute element instead of accessing a main memory. Example 18 includes the computer-readable medium of example 16, further comprising one or more instructions that when executed on the processor configure the processor to perform one or more operations to cause the fabric and the memory controller to enter the low power consumption state at least partially in response to the main memory entering a self-refresh operation. Example 19 includes the computer-readable medium of example 16, further comprising one or more instructions that when executed on the processor configure the processor to perform one or more operations to cause the fabric and the memory controller to enter the low power consumption state at least partially in response to occurrence of one or more hardware events in an SOC integrated circuit. Example 20 includes the computer-readable medium of example 16, further comprising one or more instructions that when executed on the processor configure the processor to perform one or more operations to cause the fabric and the memory controller to enter the low power consumption state at least partially in response to occurrence of one or more software hints in an SOC integrated circuit.

Example 21 includes a computing system comprising: memory to store date to be accessed by one or more processor cores of on an SOC integrated circuit device, wherein the memory is external to the SOC integrated circuit device; the SOC integrated circuit device to comprise a fabric, a memory controller, coupled to the memory, and logic, at least a portion of which is in hardware, to cause the fabric and the memory controller to enter a low power consumption state at least partially in response to a determination that the fabric and the memory controller are idle and while one or more of the one or more processor cores are in an active state. Example 22 includes the system of example 21, wherein the active state is to comprise an operating state in which at least one of the one or more processor cores is executing one or more operations by accessing a local memory or cache of the compute element instead of accessing the memory. Example 23 includes the system of example 21, wherein the logic is to cause the fabric and the memory controller to enter the low power consumption state at least partially in response to the memory entering a self-refresh operation. Example 24 includes the system of example 21, wherein a memory subsystem on the SOC integrated circuit is to comprise the memory controller and a physical input/output interface. Example 25 includes the system of example 21, wherein the logic is to cause the fabric and the memory controller to enter the low power consumption state at least partially in response to one or more: occurrence of one or more hardware events in an SOC integrated circuit or occurrence of one or more software hints in an SOC integrated circuit.

Example 26 includes an apparatus comprising means to perform a method as set forth in any preceding example.

Example 27 includes machine-readable storage including machine-readable instructions, when executed, to implement a method or realize an apparatus as set forth in any preceding example.

In various embodiments, the operations discussed herein, e.g., with reference to FIGS. 1-6, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-6.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   logic, at least a portion of which is in hardware, to cause a fabric and a memory controller to enter a low power consumption state at least partially in response to a determination that the fabric and the memory controller are idle and while a compute element, coupled to the fabric and the memory controller, is in an active state, wherein the memory controller and the fabric are to be shared amongst a plurality of components of a System on Chip (SOC) device, wherein the plurality of components of the SOC comprise the fabric, the memory controller, and the compute element, wherein the compute element is to be prevented from accessing the shared fabric and the shared memory controller in response to a determination that the fabric and the memory controller have entered the low power consumption state.

2. The apparatus of claim 1, wherein the active state is to comprise an operating state in which the compute element is executing one or more operations by accessing a local memory or cache of the compute element instead of accessing a main memory.

3. The apparatus of claim 2, wherein a System On Chip (SOC) integrated circuit is to comprise the logic, the fabric, and the memory controller, wherein the main memory is external to the SOC.

4. The apparatus of claim 2, wherein the logic is to cause the fabric and the memory controller to enter the low power consumption state at least partially in response to the main memory entering a self-refresh operation.

5. The apparatus of claim 1, wherein a system on chip integrated circuit is to comprise the logic, the fabric, and the memory controller.

6. The apparatus of claim 1, wherein the compute element is to comprise one or more of: a processor, having one or more processor cores, a graphics processing unit, image processing logic, or media processing logic.

7. The apparatus of claim 1, wherein a memory subsystem on an SOC integrated circuit is to comprise the memory controller and a physical input/output interface.

8. The apparatus of claim 1, wherein the logic is to cause the fabric and the memory controller to enter the low power consumption state at least partially in response to occurrence of one or more hardware events in an SOC integrated circuit.

9. The apparatus of claim 1, wherein the logic is to cause the fabric and the memory controller to enter the low power consumption state at least partially in response to occurrence of one or more software hints in an SOC integrated circuit.

10. A method comprising:
    causing a fabric and a memory controller to enter a low power consumption state at least partially in response to a determination that the fabric and the memory controller are idle and while a compute element, coupled to the fabric and the memory controller, is in an active state,
    wherein the memory controller and the fabric are shared amongst a plurality of components of a System on Chip (SOC) device, wherein the plurality of components of the SOC comprise the fabric, the memory controller, and the compute element, wherein the compute element is prevented from accessing the shared fabric and the shared memory controller in response to a determination that the fabric and the memory controller have entered the low power consumption state.

11. The method of claim 10, wherein the active state comprises an operating state in which the compute element is executing one or more operations by accessing a local memory or cache of the compute element instead of accessing a main memory.

12. The method of claim 11, further comprising causing the fabric and the memory controller to enter the low power consumption state at least partially in response to the main memory entering a self-refresh operation.

13. The method of claim 11, further comprising coupling the memory controller to the main memory via a physical input/output interface.

14. The method of claim 10, further comprising causing the fabric and the memory controller to enter the low power consumption state at least partially in response to occurrence of one or more hardware events in an SOC integrated circuit.

15. The method of claim 10, further comprising causing the fabric and the memory controller to enter the low power consumption state at least partially in response to occurrence of one or more software hints in an SOC integrated circuit.

16. A non-transitory computer-readable medium comprising one or more instructions that when executed on a processor configure the processor to perform one or more operations to:
cause a fabric and a memory controller to enter a low power consumption state at least partially in response to a determination that the fabric and the memory controller are idle and while a compute element, coupled to the fabric and the memory controller, is in an active state,
wherein the memory controller and the fabric are to be shared amongst a plurality of components of a System on Chip (SOC) device, wherein the plurality of components of the SOC comprise the fabric, the memory controller, and the compute element, wherein the compute element is to be prevented from accessing the shared fabric and the shared memory controller in response to a determination that the fabric and the memory controller have entered the low power consumption state.

17. The non-transitory computer-readable medium of claim 16, wherein the active state comprises an operating state in which the compute element is executing one or more operations by accessing a local memory or cache of the compute element instead of accessing a main memory.

18. The non-transitory computer-readable medium of claim 16, further comprising one or more instructions that when executed on the processor configure the processor to perform one or more operations to cause the fabric and the memory controller to enter the low power consumption state at least partially in response to the main memory entering a self-refresh operation.

19. The non-transitory computer-readable medium of claim 16, further comprising one or more instructions that when executed on the processor configure the processor to perform one or more operations to cause the fabric and the memory controller to enter the low power consumption state at least partially in response to occurrence of one or more hardware events in an SOC integrated circuit.

20. The non-transitory computer-readable medium of claim 16, further comprising one or more instructions that when executed on the processor configure the processor to perform one or more operations to cause the fabric and the memory controller to enter the low power consumption state at least partially in response to occurrence of one or more software hints in an SOC integrated circuit.

21. A computing system comprising:
memory to store data to be accessed by one or more processor cores of on an SOC integrated circuit device, wherein the memory is external to the SOC integrated circuit device;
the SOC integrated circuit device to comprise a fabric, a memory controller, coupled to the memory, and logic, at least a portion of which is in hardware, to cause the fabric and the memory controller to enter a low power consumption state at least partially in response to a determination that the fabric and the memory controller are idle and while one or more of the one or more processor cores are in an active state,
wherein the memory controller and the fabric are to be shared amongst a plurality of components of a System on Chip (SOC) device, wherein the plurality of components of the SOC comprise the fabric, the memory controller, and the compute element, wherein the compute element is to be prevented from accessing the shared fabric and the shared memory controller in response to a determination that the fabric and the memory controller have entered the low power consumption state.

22. The system of claim 21, wherein the active state is to comprise an operating state in which at least one of the one or more processor cores is executing one or more operations by accessing a local memory or cache of the compute element instead of accessing the memory.

23. The system of claim 21, wherein the logic is to cause the fabric and the memory controller to enter the low power consumption state at least partially in response to the memory entering a self-refresh operation.

24. The system of claim 21, wherein a memory subsystem on the SOC integrated circuit is to comprise the memory controller and a physical input/output interface.

25. The system of claim 21, wherein the logic is to cause the fabric and the memory controller to enter the low power consumption state at least partially in response to one or more: occurrence of one or more hardware events in an SOC integrated circuit or occurrence of one or more software hints in an SOC integrated circuit.

* * * * *